US011845667B2

(12) United States Patent
Rimboeck et al.

(10) Patent No.: US 11,845,667 B2
(45) Date of Patent: Dec. 19, 2023

(54) METHOD FOR PRODUCING CHLOROSILANES

(71) Applicant: WACKER CHEMIE AG, Munich (DE)

(72) Inventors: Karl-Heinz Rimboeck, Heldenstein (DE); Natalia Sofina, Burghausen (DE)

(73) Assignee: Wacker Chemie AG, Munich (DE)

(*) Notice: Subject to any disclaimer, the term of this patent is extended or adjusted under 35 U.S.C. 154(b) by 680 days.

(21) Appl. No.: 17/048,304

(22) PCT Filed: Apr. 18, 2018

(86) PCT No.: PCT/EP2018/059933
§ 371 (c)(1),
(2) Date: Oct. 16, 2020

(87) PCT Pub. No.: WO2019/201439
PCT Pub. Date: Oct. 24, 2019

(65) Prior Publication Data
US 2021/0163302 A1    Jun. 3, 2021

(51) Int. Cl.
*C01B 33/107* (2006.01)
*B01J 8/24* (2006.01)
(Continued)

(52) U.S. Cl.
CPC ........... *C01B 33/10742* (2013.01); *B01J 8/24* (2013.01); *C01P 2004/51* (2013.01);
(Continued)

(58) Field of Classification Search
CPC . C01B 33/10742; C01B 33/02; C01B 33/043; C01B 33/1071; B01J 8/24;
(Continued)

(56) References Cited

U.S. PATENT DOCUMENTS

| 4,092,446 A | 5/1978 | Padovani et al. |
| 4,986,971 A | 1/1991 | Forwald et al. |

(Continued)

FOREIGN PATENT DOCUMENTS

| CN | 1680399 A | 10/2005 |
| CN | 103201219 A | 7/2013 |

(Continued)

OTHER PUBLICATIONS

Translation of DE-102010044108-A1 (Year: 2012).*
(Continued)

*Primary Examiner* — Colin W. Slifka
*Assistant Examiner* — Logan Edward Laclair
(74) *Attorney, Agent, or Firm* — BROOKS KUSHMAN P.C.

(57) ABSTRACT

Chlorosilanes of the general formula $H_nSiCl_{4-n}$ and/or $H_mCl_{6-m}Si_2$, where n=1-4 and m=0-4, are produced in a fluidized bed reactor by reaction of a hydrogen chloride-containing reaction gas with a silicon contact mass granulation mixture composed of a coarse grain fraction and a fine grain fraction, wherein the average particle size of the fine grain fraction $d_{50,fine}$ is smaller than the average particle size of the coarse grain fraction $d_{50,coarse}$.

19 Claims, 1 Drawing Sheet

(51) Int. Cl.
*C30B 28/14* (2006.01)
*C30B 29/06* (2006.01)

(52) U.S. Cl.
CPC ...... *C01P 2006/10* (2013.01); *C01P 2006/80* (2013.01); *C30B 28/14* (2013.01); *C30B 29/06* (2013.01)

(58) Field of Classification Search
CPC .............. C01P 2004/51; C01P 2006/10; C01P 2006/80; C01P 2004/53; C01P 2004/61; C30B 28/14; C30B 29/06
See application file for complete search history.

(56) References Cited

U.S. PATENT DOCUMENTS

| | | | |
|---|---|---|---|
| 8,557,210 | B2 | 10/2013 | Fabry et al. |
| 2005/0226803 | A1 | 10/2005 | Pflugler et al. |
| 2011/0229398 | A1 | 9/2011 | Troll et al. |
| 2013/0295385 | A1* | 11/2013 | Hertlein ................ C23C 16/24 427/213 |
| 2014/0050648 | A1 | 2/2014 | Becker et al. |
| 2018/0105427 | A1 | 4/2018 | Babl et al. |

FOREIGN PATENT DOCUMENTS

| | | | | |
|---|---|---|---|---|
| DE | 3938897 | C2 | 7/1992 | |
| DE | 102008041974 | A1 * | 3/2010 | ............. B01J 8/006 |
| DE | 102008041974 | A1 | 3/2010 | |
| DE | 102010044108 | A1 * | 5/2012 | ........... C01B 33/107 |
| DE | 102010044108 | A1 | 5/2012 | |
| JP | 63170210 | A | 7/1988 | |
| RU | 2008128297 | A | 1/2010 | |
| TW | 201634113 | A | 10/2016 | |
| WO | 2007101789 | A1 | 9/2007 | |
| WO | 2010028878 | A1 | 3/2010 | |
| WO | 2016198264 | A1 | 12/2016 | |

OTHER PUBLICATIONS

Translation of DE-102008041974-A1 (Year: 2010).*
U.S. Appl. No. Unknown Atty. Dkt. No. WASNO544PUSA.
Corresponding English Language.
US2005226803A1.
US20140050648A1.
US2011229398A1.
English Abstract.
US2018105427A1.
Erhard Sirtl et al., Über die Reduktion von Chlorsilanen mit Wasserstoff, ZAAC—Zeitschrift für Anorganische und Allgemeine Chemie (Journal for Inorganic and General Chemistry), 1964, pp. 113-123, vol. 332, Issue 3-4, Weinheim, Germany.
L.P. Hunt et al., A Thorough Thermodynamic Evaluation of the Silicon-Hydrogen-Chlorine System, Journal of the Electrochemical Society, 1972, pp. 1741-1745, vol. 119, Issue 12, USA.
N.P. Lobusevich et al., Effect of Dispersion of Silicon and Copper in Catalysts on Direct Synthesis, Khimiya Kremniiorganich. Soed., 1988, pp. 27-35.

* cited by examiner

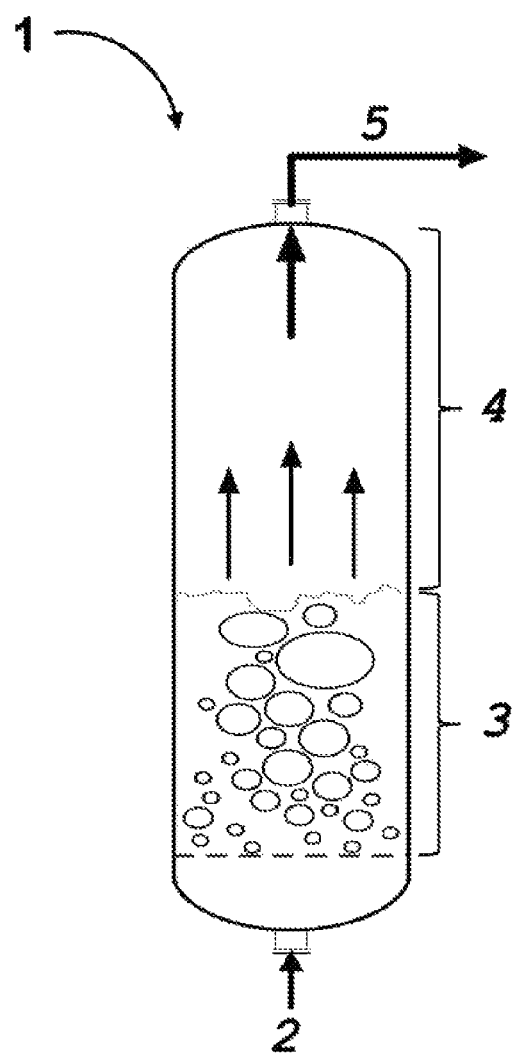

METHOD FOR PRODUCING CHLOROSILANES

CROSS REFERENCE TO RELATED APPLICATIONS

This application is the U.S. National Phase of PCT Appln. No. PCT/EP2018/059933 filed Apr. 18, 2018, the disclosure of which is incorporated in its entirety by reference herein.

BACKGROUND OF THE INVENTION

1. Field of the Invention

The invention relates to a method for producing chlorosilanes of general formula $H_nSiCl_{4-n}$ and/or $H_mCl_{6-m}Si_2$, where n=1 to 4 and m=0 to 4, in a fluidized bed reactor, by reacting a hydrogen chloride-containing reaction gas with a contact mass containing silicon as a granulation mixture composed of a coarse grain fraction and a fine grain fraction.

2. Description of the Related Art

The production of polycrystalline silicon as a starting material for the manufacture of chips or solar cells is typically carried out by decomposition of volatile halogen compounds thereof, in particular chlorosilanes such as trichlorosilane (TCS, $HSiCl_3$). In order to meet the requirements for the manufacture of chips or solar cells the polycrystalline silicon must have a purity of at least 99.9%. Above a purity of more than 99.9% the term ultrahigh purity silicon is used.

The production of chlorosilanes, in particular TCS, may be carried out essentially by three processes which are based on the following reactions (cf. WO 2010/028878 A1 and WO 2016/198264 A1):

$$SiCl_4+H_2 \rightarrow SiHCl_3+HCl+byproducts \quad (1)$$

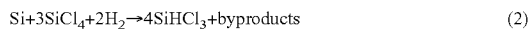

$$Si+3SiCl_4+2H_2 \rightarrow 4SiHCl_3+byproducts \quad (2)$$

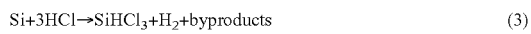

$$Si+3HCl \rightarrow SiHCl_3+H_2+byproducts \quad (3)$$

Byproducts that may be generated include further halosilanes, for example monochlorosilane ($H_3SiCl$), dichlorosilane ($H_2SiCl_2$), silicon tetrachloride (STC, $SiCl_4$) and di- and oligosilanes. Impurities such as hydrocarbons, organochlorosilanes and metal chlorides may also be a constituent of the byproducts. Thus, in order to produce high-purity TCS a distillation typically follows.

The high temperature conversion according to reaction (1) is an endothermic process and is typically carried out under high pressure at temperatures between 600° C. and 900° C.

The low temperature conversion (LTC) according to reaction (2) is performed in the presence of a catalyst (for example copper-containing catalysts). The LTC may be performed in a fluidized bed reactor in the presence of $Si_{mg}$ at temperatures between 400° C. and 700° C.

The hydrochlorination (HC) according to reaction (3) allows the production of chlorosilanes from metallurgical silicon ($Si_{mg}$, "metallurgical grade" silicon) and hydrogen chloride (HCl) in a fluidized bed reactor, said reaction being exothermic. This generally affords TCS and STC as primary products. A process for HC is disclosed for example in U.S. Pat. No. 4,092,446 A.

The most important parameters affecting the performance of HC are in principle TCS selectivity, HCl conversion, silicon conversion and the formation of byproducts. HC is based on thermal equilibrium reactions of chlorosilanes such as have been described for example by Sirtl et al. (Z. anorg. allg. Chem. 1964, 332, 113-216) or by Hunt et al. (J. Electrochem. Soc. 1972, 119, 1741-1745). HC in thermal equilibrium in principle forms not only chlorine-containing monosilanes ($H_nCl_{4-n}$ Si where n=1-4) but also high-boiling di-, oligo- and/or polychlorosilanes.

The term "high-boiling compound" or "high boiler" refers to compounds consisting of silicon, chlorine and optionally hydrogen, oxygen and/or carbon and having a higher boiling point than STC (57° C. at 1013 hPa). Generally concerned here are disilanes $H_mCl_{6-m}Si_2$ (m=0-4) and higher oligo- or poly(chloro)silanes.

WO 2007/101789 A1 and the literature cited therein mention processes which convert high boilers back to chlorine-containing monosilanes, preferably TCS, and thus return them to the value chain. However, these processes entail additional technical complexity. Processes which minimize or even avoid the formation of unwanted high boilers directly during production are therefore particularly desirable.

In addition to undesirably high formation of STC and high boilers, process costs are in principle also increased by unconverted HCl and unconverted silicon.

It is known in the production of chlorosilanes in fluidized bed reactors to specifically remove fine grain fractions of the silicon particles to be employed. For example Lobusevich et al. recite an operating granulation for silicon of 70 to 500 μm, wherein 70 μm is the minimum and 500 μm is the maximum grain size (grain size limits or range limits) and the values are equivalent diameters (Khimiya Kremniiorganich. Soed. 1988, 27-35). The operating granulation describes the granulation introduced into the fluidized bed reactor. DE 3938897 A1 recites a preferred operating granulation for silicon of 50-800 μm and RU 2008 128 297 A recites a preferred operating granulation of 90-450 μm. Lobusevich et al. report that the when choosing the contact mass grain size for the synthesis of methyl chlorosilane, ethyl chlorosilane and TCS the interaction between solids and gas must be considered in order to achieve maximum stability and efficiency of the process. Thus in the synthesis of TCS (at 400° C.) an operating granulation of 2 to 3 mm resulted in a reduction of the reaction rate by about 25% to 30% compared to an operating granulation of 70 to 500 μm. When copper-containing catalysts are added, the reaction with silicon particles of the operating fraction 2 to 3 mm occurs already at 250° C. The reaction rate matches that of the uncatalyzed variant at 400° C. In both cases—both for the catalyzed variant and for the uncatalyzed variant—increasing the silicon particle size results in an increased TCS selectivity and in a reduced formation of polycchlorosilanes (high boilers).

Increasing the particle size in principle entails greater energy costs since a higher reaction temperature is required to accelerate the reaction and a higher gas velocity is required to generate the fluidized bed. While Lobusevich et al. report that use of a proportion of smaller silicon particles in the context of a polydisperse particle mixture enhances the activity of the silicon on account of an increased surface area, the use of proportions of small silicon particles is associated with difficulties since increased discharge of silicon particles from the reactor and aggregation of the particles can occur. It is therefore advantageous according to Lobusevich et al., despite the higher energy costs, to reduce the breadth of the grain size distribution of the employed silicon particles and to increase the average particle size.

The present invention has for its object to provide a particularly economic process for chlorosilane production.

SUMMARY OF THE INVENTION

Economical chlorosilane production is achieved by a process for producing chlorosilanes of the general formula $H_nSiCl_{4-n}$ and/or $H_mCl_{6-m}Si_2$, where n=1-4 and m=0-4 in a fluidized bed reactor, by reaction of a hydrogen chloride-containing reaction gas with a contact mass which contains silicon as a granulation mixture composed of a coarse grain fraction and a fine grain fraction, wherein the average particle size of the fine grain fraction $d_{50,fine}$ is smaller than the average particle size of the coarse grain fraction $d_{50,coarse}$.

BRIEF DESCRIPTION OF THE DRAWINGS

FIG. 1 illustrates a fluidized bed reactor for preparation of chlorosilanes.

DETAILED DESCRIPTION OF THE PREFERRED EMBODIMENTS

The term "granulation" is to be understood as meaning in particular a mixture of silicon particles producible for example by comminution of chunk silicon by crushing and milling plants. The chunk silicon may have an average particle size of >10 mm, preferably >20 mm, more preferably >50 mm. Granulations may be classified into fractions essentially by sieving and/or sifting.

Granulations may be produced by/from
crushing and milling of chunk silicon; optionally followed by a sieving and/or sifting (classifying)
wastes, in particular in the form of dusts, which are generated in the processing (crushing, milling, sawing) of various silicon types (wafer, polycrystalline/multicrystalline/single-crystal silicon, $Si_{mg}$) and optionally classified; in the form of oversize and/or undersize, wherein fractions lying outside the target granulation are concerned
processes for producing granulated $Si_{mg}$ or polycrystalline silicon.

A mixture of different granulations may be described as a granulation mixture and the granulations which make up the granulation mixture may be described as granulation fractions. Granulation fractions may be categorized relative to one another into coarse grain fractions and fine grain fractions. In a granulation mixture it is possible in principle to categorize more than one granulation fraction into a coarse grain fraction and/or a fine grain fraction.

It is preferable when the difference ($d_{50,coarse}-d_{50,fine}$) is >1 µm, preferably >10 µm, more preferably >50 µm, and in particular >100 µm. It is preferable when the difference ($d_{50,coarse}-d_{50,fine}$) is in a range from 10 to 700 µm, preferably 50 to 500 µm, more preferably 75 to 450 µm, and in particular 100 to 350 µm.

The average particle size of the coarse grain fraction $d_{50,coarse}$ may be 100 to 800 µm, preferably 125 to 600 µm, more preferably 150 to 500 µm, and in particular 175 to 400 µm.

The average particle size of the fine grain fraction $d_{50,fine}$ may be 100 to 500 µm, preferably 5 to 400 µm, particularly preferably 10 to 300 µm, in particular 15 to 175 µm.

Compared to the typically employed coarse grain fractions the use according to the invention of the fine grain fraction results in a shift in the average particle size of the granulation mixture $d_{50,mixture}$ toward smaller particle sizes. The particle size distribution altogether becomes broader.

It has been found that, surprisingly, such granulation mixtures having a broader particle size distribution generate a smaller amount of high-boiling byproducts than is the case for known processes while achieving at least equal TCS selectivity. The prejudice of Lobusevich et al. according to which TCS selectivity increases and the formation of high boilers decreases with increasing average particle size only in the case of granulation mixtures having a narrow size distribution is thus overcome. It was moreover found that the process according to the invention makes it possible to achieve markedly higher HCl conversions. The negative effects to be expected according to current knowledge upon reducing the average particle size, such as increased discharge of relatively small silicon particles from the reactor and the occurrence of aggregation effects, were surprisingly not observed. In fact, an improved fluidization behavior of the contact mass was observed in the process according to the invention. In addition the presence of the fine grain fraction results in the further advantage of an improved flow behavior of the granulation mixture, thus simplifying in particular the transport and feeding thereof to the reactor.

The value $d_{50}$ specifies the average particle size (cf. ISO 13320). The value $d_{50}$ means that 50% of the particles are smaller than the specified value. Further important parameters for the characterization of a particle size distribution are for example the value $d_{10}$ as a measure for the smaller particles and the value $d_{90}$ as a measure for the larger particles in the corresponding fraction or granulation mixture. The values $d_{10}$ and $d_{90}$ may also be used for describing the breadth of a particle size distribution:

$$\text{Breadth}=d_{90}-d_{10}$$

To determine the relative breadth of a particle size distribution the so-called span of a particle size distribution may be used:

$$\text{Span}=(d_{90}-d_{10})/d_{50}$$

The span is in principle used when particle size distributions having very different average particle sizes are to be compared.

Determination of particle size distribution may be carried out according to ISO 13320 (laser diffraction) and/or ISO 13322 (image analysis). Calculation of average particle sizes/diameters from particle size distributions may be carried out according to DIN ISO 9276-2.

It is preferable when the granulation mixture has a p-modal, volume-weighted distribution density function, wherein p=1 to 10, preferably p=1 to 6, more preferably p=1 to 3, and in particular p=1 or 2. For example a 2-modal distribution density function has two maxima.

The use of granulation mixtures having a multimodal (for example p=5 to 10) distribution density function makes it possible to avoid sifting effects (separation of individual grain fractions in the fluidized bed, for example two-part fluidized bed). These effects occur in particular when the maxima of the distribution density function of the granulation mixture are far apart.

It may further be preferable when the coarse grain fraction and/or the fine grain fraction have a p-modal, volume-weighted distribution density function, wherein p=1 to 5, preferably p=1 to 3, more preferably p=1 or 2.

As already noted, fine grain fractions of silicon having different particle size distributions may be generated as a waste product in various processes and may in combination result in a multimodal (p 2) fine grain fraction. The purchase of such fine grain fractions is typically inexpensive and improves the economy of the process. The use of such fine grain fractions further makes it possible to use a coarser standard operating fraction, thus freeing capacity in milling plants.

It is preferable when $d_{50,fine}$ and $d_{50,coarse}$ are present in a grain size ratio (GSR) $d_{50,fine}/d_{50,coarse}$ of 0.01 to 0.99, preferably of 0.02 to 0.9, more preferably of 0.03 to 0.7, and in particular of 0.04 to 0.6. The GSR may also be referred to as the particle size ratio.

The fine grain fraction and the coarse grain fraction are preferably present in a mass ratio (MR) m(fine)/m(coarse) of 0.01 to 99, more preferably of 0.05 to 20, yet more preferably of 0.09 to 10, and in particular of 0.1 to 4.

It is preferable when the granulation mixture has a span of the particle size distribution $(d_{90}-d_{10})/d_{50}$ of 0.01 to 2000, more preferably of 0.1 to 500, yet more preferably of 1 to 100, and in particular of 1.5 to 10.

The contact mass is in particular the granulation mixture. It is preferable when the contact mass contains no further components. Preferably concerned here is silicon containing not more than 5% by weight, more preferably not more than 2% by weight, and in particular not more than 1% by weight, of other elements as impurities. Preferably concerned here is $Si_{mg}$ which typically has a purity of 98% to 99.9%. A typical composition is for example a composition comprising 98% silicon, wherein the remaining 2% are generally largely composed of the following elements: Fe, Ca, Al, Ti, Cu, Mn, Cr, V, Ni, Mg, B, C, P and O. The following elements may also be present: Co, W, Mo, As, Sb, Bi, S, Se, Te, Zr, Ge, Sn, Pb, Zn, Cd, Sr, Ba, Y and Cl. However, the use of silicon having a lower purity of 75% to 98% is also possible. It is however preferable when the silicon proportion is greater than 75%, more preferably greater than 85%, and most preferably greater than 85%.

Some of the elements present in the silicon as impurities have a catalytic activity. Therefore, the addition of a catalyst is in principle unnecessary. However, the presence of an additional catalyst may have a positive effect on the process, in particular in respect of its selectivity.

In one embodiment the employed silicon is a mixture of $Si_{mg}$ and ultrahigh purity silicon (purity>99.9%). In other words a granulation mixture comprising $Si_{mg}$ and ultrahigh purity silicon is concerned. It is preferable here when the proportion of $Si_{mg}$ is at least 50% by weight, more preferably at least 70% by weight, and most preferably at least 90% by weight, based on the total weight of the granulation mixture. The ultrahigh purity silicon is in particular a constituent of the fine grain fraction. It is further possible for the fine grain fraction to contain exclusively ultrahigh purity silicon.

In a further embodiment the silicon employed is $Si_{mg}$ and ultrahigh purity silicon, wherein the proportion of $Si_{mg}$ is less than 50% by weight based on the total weight of the granulation mixture. It is preferable here when the granulation mixture/the contact mass additionally comprises a catalyst. The ultrahigh purity silicon and/or the catalyst are preferably constituents of the fine grain fraction. It is preferable when the fine grain fraction consists of ultrahigh purity silicon.

In another embodiment the employed silicon is exclusively ultrahigh purity silicon and the contact mass/granulation mixture contains a catalyst. It is preferable here when the catalyst is a constituent of the fine grain fraction.

The fine grain fraction may for example be a byproduct generated in the deposition of polycrystalline silicon according to the Siemens process or the granulate process. It may further be a byproduct generated in the mechanical treatment of polycrystalline/multicrystalline or single-crystal silicon (purity>99.9%). The ultrahigh purity silicon dust generated as a byproduct may be subjected to a milling process to obtain a desired particle size and/or a classifying process to obtain a granulation having desired grain size limits.

Ultrahigh purity silicon may in principle be converted by HC just in the presence of small amounts of one of the elements cobalt, molybdenum and tungsten (generally already present as an impurity in the ultrahigh purity silicon). A common conversion with $Si_{mg}$ which contains greater amounts of the catalytically active elements as impurities is not compulsory. However, chlorosilane selectivity may be increased by addition of a catalyst. This may be the case in the present process in particular when the proportion of ultrahigh purity silicon in the granulation mixture is greater than the proportion of $Si_{mg}$ and/or when the granulation mixture comprises exclusively ultrahigh purity silicon.

The catalyst may be one or more elements from the group comprising Fe, Cr, Ni, Co, Mn, W, Mo, V, P, As, Sb, Bi, O, S, Se, Te, Ti, Zr, C, Ge, Sn, Pb, Cu, Zn, Cd, Mg, Ca, Sr, Ba, B, Al, Y, Cl. The catalyst is preferably selected from the group comprising Fe, Al, Ca, Ni, Mn, Cu, Zn, Sn, C, V, Ti, Cr, B, P, O, Cl and mixtures thereof. As mentioned previously these catalytically active elements are in a certain proportion already present in silicon as an impurity, for example in oxidic or metallic form, as silicides or in other metallurgical phases or as oxides or chlorides. The proportion thereof depends on the purity of the employed silicon.

The catalyst may be added to the contact mass for example in metallic, alloyed and/or salt-like form. Chlorides and/or oxides of the catalytically active elements may be concerned in particular. Preferred compounds are CuCl, $CuCl_2$, CuO or mixtures thereof. The contact mass may further contain promoters, for example Zn and/or zinc chloride.

The elemental composition of the employed silicon and of the contact mass may be determined by x-ray fluorescence analysis for example.

It is preferable when the fine grain fraction and the coarse grain fraction are supplied to the fluidized bed reactor as a pre-prepared granulation mixture. Any further constituents of the contact mass may likewise be present therein. The higher fine grain fraction according to the invention results in an improved flow and thus conveying behavior of the pre-prepared granulation mixture.

The fine grain fraction and the coarse grain fraction may also be supplied to the fluidized bed reactor separately, in particular via separate feeds and containers. Mixing is thus in principle effected during formation of the fluidized bed (in situ). Any further constituents of the contact mass may likewise be supplied separately or as a constituent of one of the two grain fractions.

It is preferable when the process is performed at a temperature of 280° C. to 400° C., more preferably 320° C. to 380° C., and most preferably 340° C. to 360° C. The pressure in the fluidized bed reactor is by preference 0.01 to 0.6 MPa, more preferably 0.03 to 0.35 MPa, and most preferably 0.05 to 0.3 MPa.

The reaction gas contains, by preference, at least 50 vol %, preferably at least 70 vol %, and more preferably at least 90 vol %, of HCl. In addition to HCl the reaction gas may further contain one or more components selected from the group comprising $H_2$, $HnSiCl_{4-n}$ (n=0 to 4), $H_mCl_{6-m}Si_2$ (m=0 to 6), $H_qCl_{6-q}Si_2O$ (q=0 to 4), $CH_4$, $C_2H_6$, CO, $CO_2$, $O_2$, and $N_2$. These components may derive from HCl recovered in an integrated system. HCl and silicon are by preference present in an HCl/Si molar ratio of 5:1 to 3:1, more preferably 4:1 to 3:1, yet more preferably 3.6:1 to 3:1, and in particular of 3.4:1 to 3.1:1. HCl and the contact mass/granulation mixture or the grain fractions thereof are in particular continuously added during the reaction such that the abovementioned ratio is established.

It is preferable when a quotient of fluidized bed height to reactor diameter is 10:1 to 1:1, more preferably 8:1 to 2:1, and most preferably 6:1 to 3:1. The fluidized bed height is the thickness or extent of the fluidized bed.

The chlorosilanes produced with the process according to the invention are preferably at least one chlorosilane selected from the group comprising monochlorosilane, dichlorosilane, TCS, $Si_2Cl_6$ and $HSi_2Cl_5$. It is particularly preferable when TCS is concerned.

The process according to the invention is preferably integrated into an integrated system for producing polycrystalline silicon. The integrated system comprises in particular the following processes:
  Production of TCS according to the described process.
  Purification of the produced TCS to afford semiconductor-quality TCS.
  Deposition of polycrystalline silicon, preferably by the Siemens process or as a granulate.
  Further processing of the obtained polycrystalline silicon.
  Recycling of the ultrahigh purity silicon dust generated in the production/further processing of the polycrystalline silicon by reaction according to the described process.

FIG. 1 shows by way of example a fluidized bed reactor 1 for performing the process according to the invention. The reaction gas 2 is preferably injected into the contact mass from below and optionally from the side (for example tangentially or orthogonally to the gas stream from below), thus fluidizing the particles of the contact mass to form a fluidized bed 3. The reaction is generally initiated by heating the fluidized bed 3 by means of a heating apparatus (not shown) arranged externally to the reactor. Heating is typically not required during continuous operation. A portion of the particles is transported by the gas flow from the fluidized bed 3 into the free space 4 above the fluidized bed 3. The free space 4 is characterized by a very low solids density, this density decreasing in the direction of the reactor outflow.

EXAMPLES

The examples were performed in a fluidized bed reactor such as is described for example in U.S. Pat. No. 4,092,446.

All examples employed fine grain fractions and/or coarse grain fractions of the same silicon type in terms of purity, quality and content of secondary elements/impurities. The grain fractions were produced by crushing of chunk $Si_{mg}$ and subsequent milling. This was optionally followed by a final classifying by sieving. Determination of particle size distribution was carried out according to ISO 13320 and/or ISO 13322. All examples employed the following process.
General Procedure:

An initially charged bed of contact mass was first subjected to a traversing flow of nitrogen (carrier gas) until a fluidized bed was formed. The quotient of fluidized bed height to reactor diameter was set to a value of about 5. The reactor diameter was about 1 m. The fluidized bed was brought to a temperature of about 320° C. with an external heating apparatus. This temperature was kept approximately constant over the entire experimental duration using a cooling means. HCl was added and further contact mass charged such that over the total experimental duration the height of the fluidized bed remained substantially constant and a constant molar ratio of the reactants (HCl:Si) of 3:1 was established. The reactor was operated with a positive pressure of 0.1 MPa over the entire experimental duration. Respective liquid and gas samples were taken after 48 h and 49 h of running time. The condensable proportions of the product gas stream (chlorosilane gas stream) were condensed in a cold trap at −40° C., analyzed by gas chromatography (GC) and used to determine TCS selectivity and the proportion of high boilers [% by weight]. Detection was via a thermal conductivity detector. The uncondensable proportion of the product gas stream was analyzed for unconverted HCl [vol %] with an infrared spectrometer. Respective average values were formed from the obtained values after 48 and 49 h. The reactor was fully emptied and filled with new contact mass after each run.

Comparative Example 1

The contact mass consisted exclusively of a coarse grain fraction of $Si_{mg}$ ($d_{50}$=683 μm, range limits: 600-700 μm) having a narrow particle size distribution (span: 0.09, where $d_{10}$=631 μm and $d_{90}$=694 μm).
The following values were obtained:
proportion of unconverted HCl: 32 vol %
TCS selectivity: 91%
proportion of high boilers: 0.7% by weight Comparative Example 2

The contact mass consisted exclusively of a coarse grain fraction of $Si_{mg}$ ($d_{50}$=211 μm, range limits: 90-450 μm) having a broader particle size distribution (span: 1.62, where $d_{10}$=95 μm and $d_{90}$=437 μm).
The following values were obtained:
proportion of unconverted HCl: 16 vol %
TCS selectivity: 88%
proportion of high boilers: 0.7% by weight Comparative Example 3

The contact mass consisted exclusively of a fine grain fraction of $Si_{mg}$ ($d_{50}$=48.6 μm, range limit: <90 μm). The span of the particle size distribution was 1.35 ($d_{10}$=18.9 μm and $d_{90}$=84.3 μm).
The following values were obtained:
proportion of unconverted HCl: 0.7 vol %
TCS selectivity: 74%
proportion of high boilers: 0.6% by weight Working Example 1

The contact mass consisted of a granulation mixture (GM) of $Si_{mg}$ containing a fine grain fraction and a coarse grain fraction (GSR: 0.12, where $d_{50,fine}$=50.4 μm and $d_{50,coarse}$=420 μm; MR: 0.43; span: 5.22, where $d_{10,GM}$=46.0 μm and $d_{90,GM}$=840 μm). The $d_{50}$ of the GM was 152 μm. The pre-prepared GM was initially charged in the reactor as a bed and continuously supplied during the process.
The following values were obtained:
proportion of unconverted HCl: 4 vol %
TCS selectivity: 89%
proportion of high boilers: 0.2% by weight Working Example 2

The contact mass consisted of a granulation mixture (GM) of $Si_{mg}$ containing a fine grain fraction and a coarse grain fraction (GSR: 0.12, where $d_{50,fine}$=50.4 µm and $d_{50,coarse}$=420 µm; MR: 1.0; span: 7.51, where $d_{10,GM}$=34.0 µm and $d_{90,GM}$=680 µm). The $d_{50}$ of the GM was 86 µm. The pre-prepared CM was initially charged in the reactor as a bed and continuously supplied during the process.

The following values were obtained:
proportion of unconverted HCl: 2 vol %
TCS selectivity: 88%
proportion of high boilers: 0.1% by weight The results show that the process according to the invention avoids the formation of high boilers. The TCS selectivity is at a similarly high level to the comparative examples.

The invention claimed is:

1. A process for producing chlorosilanes of the general formula $H_nSiCl_{4-n}$ and/or $H_mCl_{6-m}Si_2$, where n=1-4 and m=0-4, in a fluidized bed reactor, comprising:
reacting a hydrogen chloride-containing reaction gas with a contact mass which comprises silicon as a granulation mixture composed of a coarse grain fraction and a fine grain fraction, wherein the average particle size of the fine grain fraction $d_{50,fine}$ is 5 to 400 µm and the average particle size of the coarse grain fraction $d_{50,coarse}$ is 125 to 600 µm, with the proviso that $d_{50,fine}$ is smaller than $d_{50,coarse}$ and the difference $d_{50,coarse}-d_{50,fine}$ is greater than 1 µm, wherein $d_{50,fine}$ and $d_{50,coarse}$ are present in a grain size ratio $d_{50,fine}/d_{50,coarse}$ of 0.02 to 0.9, the fine grain fraction and the coarse grain fraction are present in a mass ratio m(fine)/m(coarse) of 0.05 to 20, and wherein the granulation mixture has a span of particle size distribution $d_{90}-d_{10}/d_{50}$ of 1 to 100.

2. The process of claim 1, wherein the granulation mixture has a p-modal, volume-weighted distribution density function, where p=1 to 10.

3. The process of claim 1, wherein the granulation mixture has a p-modal, volume-weighted distribution density function, where p=1 to 3.

4. The process of claim 1, wherein $d_{50,fine}$ and $d_{50,coarse}$ are present in a grain size ratio $d_{50,fine}/d_{50,coarse}$ of 0.03 to 0.7.

5. The process of claim 1, wherein the fine grain fraction and the coarse grain fraction are present in a mass ratio m(fine)/m(coarse) of 0.09 to 10.

6. The process of claim 1, wherein the fine grain fraction and the coarse grain fraction are present in a mass ratio m(fine)/m(coarse) of 0.09 to 4.

7. The process of claim 1, wherein the granulation mixture has a span of particle size distribution $d_{90}-d_{10}/d_{50}$ of 1.5 to 10.

8. The process of claim 1, wherein the silicon is metallurgical silicon and ultrahigh purity silicon, wherein the proportion of metallurgical silicon is at least 50% by weight, based on the total weight of the contact mass.

9. The process of claim 8, wherein the ultrahigh purity silicon is a constituent of the fine grain fraction.

10. The process of claim 1, wherein the silicon is metallurgical silicon and ultrahigh purity silicon, wherein the proportion of metallurgical silicon is less than 50% by weight and the granulation mixture additionally contains a catalyst.

11. The process of claim 10, wherein the ultrahigh purity silicon and/or the catalyst are constituents of the fine grain fraction.

12. The process of claim 1, wherein the silicon is ultrahigh purity silicon and the granulation mixture contains a catalyst.

13. The process of claim 1, wherein the silicon is ultrahigh purity silicon and the granulation mixture contains a catalyst, wherein the catalyst is a constituent of the fine grain fraction.

14. The process of claim 1, wherein the fine grain fraction and the coarse grain fraction are supplied to the fluidized bed reactor as a pre-prepared granulation mixture.

15. The process of claim 1, wherein the fine grain fraction and the coarse grain fraction are each supplied to the fluidized bed reactor separately.

16. The process of claim 1, wherein a quotient of fluidized bed height to reactor diameter is 10:1 to 1:1.

17. The process of claim 1, wherein a quotient of fluidized bed height to reactor diameter is 6:1 to 3:1.

18. The process of claim 1, wherein the chlorosilanes are selected from the group comprising monochlorosilane, dichlorosilane, trichlorosilane, $Si_2Cl_6$, $HSi_2Cl_5$, and mixtures thereof.

19. The process of claim 1, which is integrated into an integrated system for producing polycrystalline silicon.

* * * * *